United States Patent
Dai

(10) Patent No.: US 9,646,819 B2
(45) Date of Patent: May 9, 2017

(54) METHOD FOR FORMING SURFACE OXIDE LAYER ON AMORPHOUS SILICON

(71) Applicant: Shenzhen China Star Optoelectronics Technology Co., Ltd., Shenzhen, Guangdong (CN)

(72) Inventor: Tianming Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 182 days.

(21) Appl. No.: 14/435,463

(22) PCT Filed: Jan. 13, 2015

(86) PCT No.: PCT/CN2015/070622
§ 371 (c)(1),
(2) Date: Apr. 14, 2015

(87) PCT Pub. No.: WO2016/101361
PCT Pub. Date: Jun. 30, 2016

(65) Prior Publication Data
US 2016/0343568 A1 Nov. 24, 2016

(30) Foreign Application Priority Data
Dec. 24, 2014 (CN) .......................... 2014 1 0819897

(51) Int. Cl.
*H01L 21/31* (2006.01)
*H01L 21/02* (2006.01)
(Continued)

(52) U.S. Cl.
CPC .. *H01L 21/02238* (2013.01); *H01L 21/02068* (2013.01); *H01L 21/02164* (2013.01);
(Continued)

(58) Field of Classification Search
CPC ........... H01L 21/02068; H01L 21/0206; H01L 21/02323; H01L 21/02343
See application file for complete search history.

(56) References Cited

U.S. PATENT DOCUMENTS

| | | | |
|---|---|---|---|
| 2003/0032267 A1* | 2/2003 | Hamatani | ............... C30B 1/023 438/486 |
| 2006/0019433 A1* | 1/2006 | Chen | ................. H01L 29/66765 438/151 |
| 2013/0306116 A1* | 11/2013 | Imai | .................. H01L 21/67034 134/95.2 |

OTHER PUBLICATIONS

Nicolas Benoit et al., "Extreme-Ultraviolet_induced Oxidation of Mo/Si Multilayers", Jul. 2008, Applied Optics, vol. 47, No. 19, pp. 3455-3462.*

(Continued)

*Primary Examiner* — Zandra Smith
*Assistant Examiner* — Evan Clinton
(74) *Attorney, Agent, or Firm* — Andrew C. Cheng

(57) ABSTRACT

The invention provides a method for forming a surface oxide layer on an amorphous silicon including steps: using a HF acid to clean a surface of the amorphous silicon; using a water to clean the surface of the amorphous silicon being cleaned by the HF acid; drying the surface of the amorphous silicon after being cleaned by the water; using an extreme ultraviolet lithography to form a first oxide layer on the surface of the amorphous silicon after being dried; using an oxidizing solution to clean the surface of the amorphous silicon with the first oxide layer to thereby form a second oxide layer; and drying the surface of the amorphous silicon with the second oxide layer. By using the extreme ultraviolet lithography to form the first oxide layer, the surface of the amorphous silicon is given with strong hydrophilicity and therefore the distribution of water would be uniform.

10 Claims, 1 Drawing Sheet

(51) Int. Cl.
*H01L 29/786* (2006.01)
*H01L 21/263* (2006.01)
*H01L 21/3105* (2006.01)
*H01L 21/321* (2006.01)
*H01L 27/12* (2006.01)

(52) U.S. Cl.
CPC .. *H01L 21/02255* (2013.01); *H01L 21/02301* (2013.01); *H01L 21/02307* (2013.01); *H01L 21/02334* (2013.01); *H01L 21/263* (2013.01); *H01L 21/3105* (2013.01); *H01L 21/32105* (2013.01); *H01L 29/786* (2013.01); *H01L 27/1274* (2013.01); *H01L 27/1296* (2013.01)

(56) References Cited

OTHER PUBLICATIONS

Kazumasa Kawase et al., "Densification of Chemical Vapor Deposition Silicon Dioxide Film Using Ozone Treatment", Oct. 20, 2009, Japanese Journal of Applied Physics, vol. 48, pp. 101401-1 through 101401-7.*

* cited by examiner

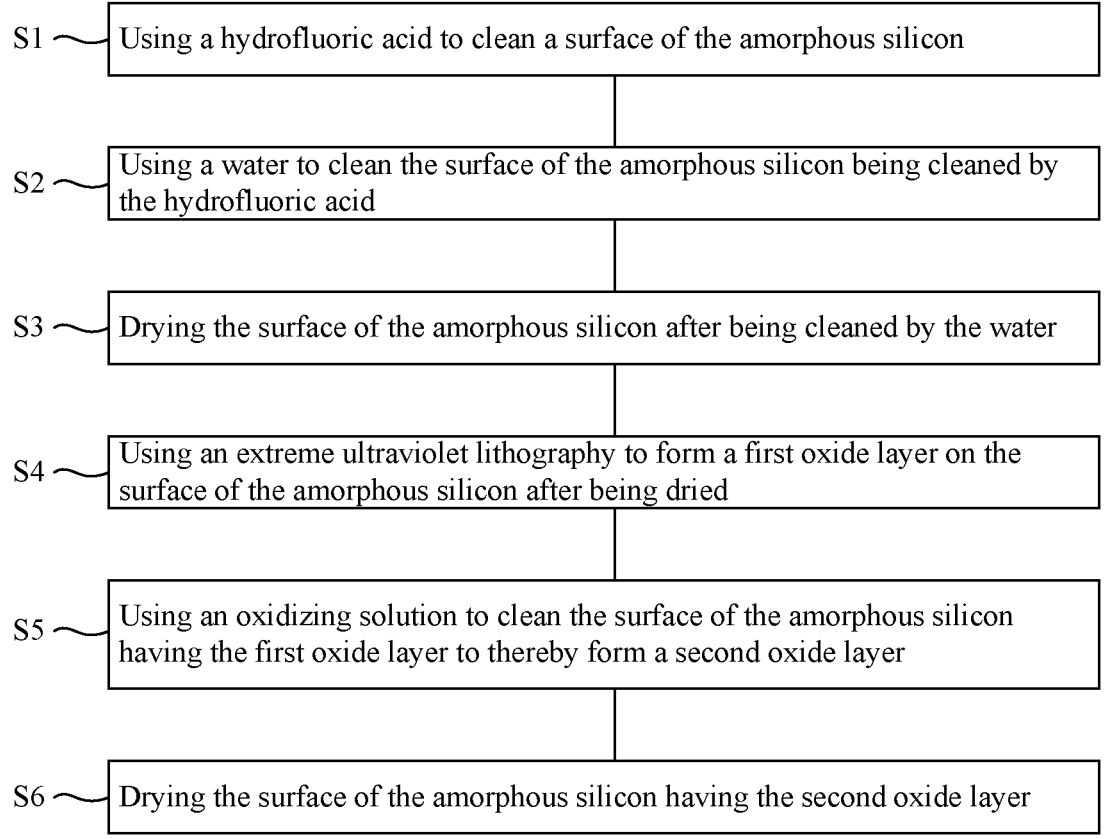

METHOD FOR FORMING SURFACE OXIDE LAYER ON AMORPHOUS SILICON

CROSS REFERENCE TO RELATED APPLICATION

This application claims the priority of Chinese Patent Application No. 201410819897.0, entitled "Method for Forming a Surface Oxide Layer on an Amorphous Silicon", filed on Dec. 24, 2014, the disclosure of which is incorporated herein by reference in its entirety.

BACKGROUND OF THE INVENTION

1. Field of the Invention

The invention relates to the field of display technology, and particularly to a method for forming a surface oxide layer on an amorphous silicon.

2. Description of Related Art

In a low temperature poly-silicon (LTPS) thin film transistor liquid crystal manufacturing process, an excimer laser annealing (ELA) technique is used to directly transform an amorphous silicon ($\alpha$-Si) into a poly-silicon (Poly-Si) and is very important in the LTPS thin film transistor liquid crystal manufacturing process. Before performing the ELA process, an appropriate treatment applied onto an $\alpha$-Si surface generally is needed, so as to remove a loose and non-uniform oxide layer naturally grown on the surface and thereby facilitate the growth of a uniform and dense oxide layer on the surface. In the prior art, a hydrofluoric (HF) acid firstly is used to remove the naturally grown oxide layer on the surface, ozone ($O_3$) then is used to oxidize the $\alpha$-Si surface so as to generate a dense oxide layer of SiOx. However, because the surface after being processed by the HF acid is $\alpha$-Si and thus has hydrophobic property, so that in the subsequent $O_3$ oxidation process, the $O_3$ dissolved in water and the $\alpha$-Si surface are non-uniformly contacted with each other, resulting in the surface oxide layer formed on the amorphous silicon being non-uniform, which would affect the uniformity of subsequent ELA crystallized surface.

SUMMARY OF THE INVENTION

Accordingly, the invention provides a method for forming a surface oxide layer on an amorphous silicon, so as to improve uniformity of the surface oxide layer on the amorphous silicon.

Specifically, the invention provides a method for forming a surface oxide layer on an amorphous silicon including the following steps of: using a hydrofluoric acid to clean a surface of the amorphous silicon; using a water to clean the surface of the amorphous silicon being cleaned by the hydrofluoric acid; drying the surface of the amorphous silicon after being cleaned by the water; using an extreme ultraviolet lithography to form a first oxide layer on the surface of the amorphous silicon after being dried; using an oxidizing solution to clean the surface of the amorphous silicon having the first oxide layer to thereby form a second oxide layer; and drying the surface of the amorphous silicon having the second oxide layer.

In an exemplary embodiment, the oxidizing solution is an ozone water with a concentration of 10~50 ppm, and a cleaning time of using the oxidizing solution is 20 s~70 s.

In an exemplary embodiment, in the step of using an extreme ultraviolet lithography to form a first oxide layer on the surface of the amorphous silicon after being dried, the first oxide layer is a silicon oxide with a thickness of 10 Å.

In an exemplary embodiment, in the step of using an oxidizing solution to clean the surface of the amorphous silicon having the first oxide layer to thereby form a second oxide layer, the second oxide layer is a silicon oxide with a thickness of 20~50 Å.

In an exemplary embodiment, in the step of using an extreme ultraviolet lithography to form a first oxide layer on the surface of the amorphous silicon after being dried, an intensity of used extreme ultraviolet is 20~50 mW/cm$^2$, and a time duration is 1 s~10 s.

In an exemplary embodiment, in the step of using a water to clean the surface of the amorphous silicon being cleaned by the hydrofluoric acid, a pure water is used to clean the hydrofluoric acid on the surface of the amorphous silicon.

In an exemplary embodiment, in the step of drying the surface of the amorphous silicon after being cleaned by the water, an air-knife of clean $N_2$ is used for the drying, and a time duration is 1 s–10 s.

In an exemplary embodiment, in the step of drying the surface of the amorphous silicon having the second oxide layer, the drying method is blowing by a clean $N_2$ or spinning.

In an exemplary embodiment, in the step of using a hydrofluoric acid to clean a surface of the amorphous silicon, a cleaning time is 20 s, and a concentration of the hydrofluoric acid is 0.25%~3%.

Sum up, in the method for forming a surface oxide layer on an amorphous silicon according to the invention, between using the hydrofluoric acid to clean the surface of the amorphous silicon and using the oxidizing solution to the clean/rinse the surface of the amorphous silicon, the extreme ultraviolet lithography is used to form the first oxide layer on the surface of the amorphous silicon, so that the surface of the amorphous silicon is given with hydrophilicity and the distribution of water would be uniform, the oxidizing solution can be in time and uniformly contacted with the amorphous silicon for oxidation treatment and thereby a uniform oxide layer can be grown on the surface of the amorphous silicon. Therefore, much more uniform and high quality poly-silicon can be manufactured by the ELA crystallizing.

BRIEF DESCRIPTION OF THE DRAWING

In order to more clearly illustrate the technical solution of an embodiment of the invention, a drawing will be used in the description of an embodiment will be given a brief description below. Apparently, the drawing in the following description only is some of embodiments of the invention, the ordinary skill in the art can obtain other drawings according to these illustrated drawing without creative effort.

The FIGURE is flowchart of a method for forming a surface oxide layer on an amorphous silicon according to a preferred embodiment of the invention.

DETAILED DESCRIPTION OF THE PREFERRED EMBODIMENT

In the following, with reference to accompanying drawing of an embodiment of the invention, a technical solution in the embodiment of the invention will be clearly and completely described. Apparently, the embodiment of the invention described below only are a part of embodiments of the invention, but not all embodiments. Based on the described embodiment of the invention, all other embodiments obtained by ordinary skill in the art without creative effort belong to the scope of protection of the invention.

Referring to the FIGURE, which is a flowchart of a method for forming a surface oxide layer on an amorphous silicon according to a preferred embodiment of the invention. In particular, the method for forming a surface oxide layer on an amorphous silicon includes the following steps:

step S1: using a hydrofluoric (HF) acid to clean a surface of the amorphous silicon;

step S2: using a water to clean the surface of the amorphous silicon being cleaned by the hydrofluoric acid;

step S3: drying the surface of the amorphous silicon after being cleaned by the water;

step S4: using an extreme ultraviolet lithography to form a first oxide layer on the surface of the amorphous silicon after being dried;

step S5: using an oxidizing solution to clean the surface of the amorphous silicon having the first oxide layer to thereby form a second oxide layer; and step S6: drying the surface of the amorphous silicon having the second oxide layer.

In this embodiment, the step of using a hydrofluoric acid to clean a surface of the amorphous silicon concretely is using the hydrofluoric acid to react with an oxide layer so as to get rid of the oxide layer on the surface of the amorphous silicon. A cleaning time is between 20 s to 40 s (seconds), and a concentration of the used hydrofluoric acid is 0.25%~3%.

In this embodiment, in order to avoid the influence of residual hydrofluoric add on the surface of the amorphous silicon to subsequent steps, the water is used to clean the surface of the amorphous silicon being cleaned by the hydrofluoric acid. Preferably, a pure water is used to clean the hydrofluoric acid on the surface of the amorphous silicon. A cleaning time is 10 s~70 s. Alternatively, a high-pressure water free of impurities can be used instead.

In this embodiment, the surface of the amorphous silicon after being cleaned by the water is dried by an air-knife of clean $N_2$ (nitrogen), a time duration is 1 s~10 s and a flow rate of the $N_2$ is 400 NL/min (normal liters per minute), so as to avoid the water substance residual on the surface of the amorphous silicon to influence the subsequent oxidation step.

In this embodiment, the extreme ultraviolet lithography uses a light to decompose oxygen so as to form the first oxide layer on the surface of the amorphous silicon. The first oxide layer is a silicon oxide with a thickness of 10 Å (angstroms), so that the surface of the amorphous silicon has strong hydrophilicity and thus the distribution of water would be uniform. An intensity of the used extreme ultraviolet is 20~500 mW/cm2 (milliwatts per square centimeter), and a time duration is 1 s~10 s.

In this embodiment, the oxidizing solution is used to clean/rinse the surface of the amorphous silicon having the first oxide layer to form the second oxide layer, the second oxide layer is a silicon oxide with a thickness of 20~50 Å. The oxidizing solution is an ozone water with a concentration of 10~50 ppm, and a cleaning time of using the oxidizing water is 20 s~70 s. Because the surface of the amorphous silicon has been formed with the first oxide layer of about 10 Å in the step S4 by the extreme ultraviolet (EUV), during the process of the ozone water contacting with the first oxide layer, hydrophobic phenomenon would not occur, the ozone water combined into the water would uniformly oxidize the silicon oxide.

In this embodiment, the surface of the amorphous silicon having the second oxide layer finally is performed with the drying treatment, and a drying method is blowing by a clean $N_2$ or spinning.

In the method for forming a surface oxide layer on an amorphous silicon according to the invention, between using the hydrofluoric acid to clean the surface of the amorphous silicon and using the oxidizing solution to clean/rinse the surface of the amorphous silicon, the extreme ultraviolet lithography is used to form the first oxide layer on the surface of the amorphous silicon, so that the surface of the amorphous silicon is given with strong hydrophilicity and thus the distribution of water would be uniform, the oxidizing solution would be in time and uniformly contacted with the amorphous silicon for oxidation treatment, a uniform oxide layer would be formed on the surface of the amorphous layer, and therefore much more uniform and high quality poly-silicon can be manufactured by the ELA crystallizing.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a surface oxide layer on an amorphous silicon, comprising:

using a hydrofluoric acid to clean a surface of the amorphous silicon so as to remove an oxide layer on the surface of the amorphous silicon;

using a water to clean the surface of the amorphous silicon being cleaned by the hydrofluoric acid;

drying the surface of the amorphous silicon after being cleaned by the water;

using an extreme ultraviolet lithography to decompose oxygen by extreme ultraviolet to perform an oxidation to the surface of the amorphous silicon without the oxide layer so as to form a first oxide layer on the surface of the amorphous silicon after being dried such that the surface of the amorphous silicon having the first oxide layer is given with hydrophilicity;

using an oxidizing solution to perform another oxidation to the surface of the amorphous silicon having the first oxide layer and thereby form a second oxide layer, wherein the second oxide layer has a thickness greater than that of the first oxide layer;

drying the surface of the amorphous silicon having the second oxide layer.

2. The method for forming a surface oxide layer on an amorphous silicon as claimed in claim 1, wherein the oxidizing solution is an ozone water with a concentration of 10~50 ppm, and a cleaning time of using the oxidizing solution is 20 s~70 s.

3. The method for forming a surface oxide layer on an amorphous silicon as claimed in claim 2, wherein in the step of using an extreme ultraviolet lithography to decompose oxygen by extreme ultraviolet to perform an oxidation to the surface of the amorphous silicon without the oxide layer so as to form a first oxide layer on the surface of the amorphous silicon after being dried, the first oxide layer is a silicon oxide with a thickness of 10 Å.

4. The method for forming a surface oxide layer on an amorphous silicon as claimed in claim 3, wherein in the step of using an oxidizing solution to perform another oxidation to the surface of the amorphous silicon having the first oxide layer and thereby form a second oxide layer, the second oxide layer is a silicon oxide with a thickness of 20~50 Å.

5. The method for forming a surface oxide layer on an amorphous silicon as claimed in claim 1, wherein in the step of using an extreme ultraviolet lithography to decompose oxygen by extreme ultraviolet to perform an oxidation to the surface of the amorphous silicon without the oxide layer so as to form a first oxide layer on the surface of the amorphous silicon after being dried, an intensity of used extreme ultraviolet is 20~50 mW/cm$^2$, and a time duration is 1 s~10 s.

6. The method for forming a surface oxide layer on an amorphous silicon as claimed in claim 1, wherein in the step of using a water to clean the surface of the amorphous silicon being cleaned by the hydrofluoric acid, a pure water is used to clean the hydrofluoric acid on the surface of the amorphous silicon.

7. The method for forming a surface oxide layer on an amorphous silicon as claimed in claim 1, wherein in the step of drying the surface of the amorphous silicon after being cleaned by the water, an air-knife of clean $N_2$ is used for the drying, and a time duration is 1 s~10 s.

8. The method for forming a surface oxide layer on an amorphous silicon as claimed in claim 1, wherein in the step of drying the surface of the amorphous silicon having the second oxide layer, the drying method is blowing by a clean $N_2$ or spinning.

9. The method for forming a surface oxide layer on an amorphous silicon as claimed in claim 1, wherein in the step of using a hydrofluoric acid to clean a surface of the amorphous silicon, a cleaning time is 20 s, and a concentration of the hydrofluoric acid is 0.25%~3%.

10. The method for forming a surface oxide layer on an amorphous silicon as claimed in claim 1, wherein the method for forming a surface oxide layer on an amorphous silicon is performed before the amorphous silicon is transformed into a poly-silicon by an excimer laser annealing (ELA) process.

* * * * *